US011342477B2

United States Patent
Samuelson et al.

(10) Patent No.: US 11,342,477 B2
(45) Date of Patent: May 24, 2022

(54) III-NITRIDE SEMICONDUCTOR DEVICES (71) Applicant: HEXAGEM AB, Hjarup (SE)

(72) Inventors: Lars Samuelson, Malmo (SE); Jonas Ohlsson, Malmo (SE); Zhaoxia Bi, Lund (SE)

(73) Assignee: HEXAGEM AB, Hjarup (SE)

( * ) Notice: Subject to any disclaimer, the term of this patent is extended or adjusted under 35 U.S.C. 154(b) by 830 days.

(21) Appl. No.: 16/076,205

(22) PCT Filed: Feb. 13, 2017

(86) PCT No.: PCT/EP2017/053187
§ 371 (c)(1),
(2) Date: Aug. 7, 2018

(87) PCT Pub. No.: WO2017/137635
PCT Pub. Date: Aug. 17, 2017

(65) Prior Publication Data
US 2021/0184071 A1 Jun. 17, 2021

(30) Foreign Application Priority Data
Feb. 12, 2016 (EP) ..................... 16155606

(51) Int. Cl.
*H01L 33/00* (2010.01)
*H01L 33/08* (2010.01)
(Continued)

(52) U.S. Cl.
CPC ............ *H01L 33/007* (2013.01); *H01L 33/08* (2013.01); *H01L 33/24* (2013.01); *H01L 33/32* (2013.01);
(Continued)

(58) Field of Classification Search
CPC ..................................................... H01L 33/007
(Continued)

(56) References Cited

U.S. PATENT DOCUMENTS

| 9,653,286 B2 | 5/2017 | Ohlsson et al. |
| 2004/0048409 A1* | 3/2004 | Biwa ........................ H01S 5/10 438/46 |
| 2015/0014631 A1 | 1/2015 | Ohlsson et al. |

FOREIGN PATENT DOCUMENTS

| EP | 1501117 A | 1/2005 |
| JP | 2003282942 A | 10/2003 |

OTHER PUBLICATIONS

D. Klimm, Handbook of Crystal Growth, Chapter 2, Phase Equilibria, 2015 Elsevier B.V., pp. 85-133.
(Continued)

*Primary Examiner* — Hsin Yi Hsieh
(74) *Attorney, Agent, or Firm* — The Marbury Law Group PLLC (57) ABSTRACT

A method of making a semiconductor device, comprising: forming a plurality of semiconductor seeds of a first III-nitride material through a mask provided over a substrate; growing a second III-nitride semiconductor material; planarizing the grown second semiconductor material to form a plurality of discrete base elements having a substantially planar upper surface. Preferably the step of planarizing involves performing atomic distribution of III type atoms of the grown second semiconductor material under heating to form the planar upper surface, and without supply of III type atoms is carried out during the step of planarization.

15 Claims, 5 Drawing Sheets

(51) Int. Cl.
   H01L 33/24    (2010.01)
   H01L 33/32    (2010.01)
   H01L 33/38    (2010.01)
(52) U.S. Cl.
   CPC .... *H01L 33/387* (2013.01); *H01L 2933/0016* (2013.01)
(58) Field of Classification Search
   USPC .......................................................... 438/509
   See application file for complete search history.

(56) References Cited

OTHER PUBLICATIONS

M. Uwaha, Handbook of Crystal Growth, Chapter 8, Growth Kinetics: Basics of Crystal Growth Mechanisms, 2015 Elsevier B.V., pp. 359-397.

Utsumi et al., "Congruent Melting of Gallium Nitride at 6GPa and its Application to Single-Crystal Growth," pp. 735-738, Nature Materials, vol. 2, Nov. 2003.

International Application No. PCT/EP2017/053187, International Search Report, dated May 10, 2017, 4pgs.

Kitamura et al., "Fabrication of GaN Hexagonal Pyramids on Dot-Patterned GaN/Sapphire Substrates via Selective Metalorganic Vapor Phase Epitaxy," Jpn. J. Appl. Phys. vol. 34, (1995), pp. 1184-1186.

Mandel et al., "Group III Nitride Core-Shell Nano- and Microrods for Optoelectronic Applications," Phys. Status Solid RRL 7, No. 10, pp. 800-814, (2013).

Chen et al., "Homoepitaxial Growth of Catalyst-Free GaN Wires on N-Polar Substrates," Applied Physics Letters 97, 151909 (2010).

Li et al., "Computing Equilibrium Shapes of Wurtzite Crystals: The Example of GaN," Physical Review Letters 115, No. 8 (2015): 085503.

Office Communication from European Patent Office, Communication Pursuant to Article 94(3) EPC and Annex to the Communication for European Patent Application No. 17705366.7 dated Jun. 28, 2021, 7 pages.

Chen, X.J. et al., "Wafer-Scale Selective Area Growth of GaN Hexagonal Prismatic Nanostructures on C-Sapphire Substrate," Journal of Crystal Growth, vol. 322, pp. 15-22, (2011); doi.10.1016/j.jcrysgro.2011.03.007.

* cited by examiner

III-NITRIDE SEMICONDUCTOR DEVICES

FIELD OF THE INVENTION

The present invention relates to III-nitride semiconductor devices and methods for forming such devices. More particularly, the invention relates to designs and processes for preparing template structures of III-nitride semiconductor material, for the purpose of carrying electronics or optical components.

BACKGROUND

The 20$^{th}$ century saw semiconductor technology emerge, develop and, eventually, change fundamental conditions of human society. Technological advancements, such as the transistor, light emitting diode, solar cell, the integrated circuit, miniaturization and monolithic processors with vast calculation power were parts of an explosive technological development where semiconductor-based products went from state of the art to outdated commodities in a matter of years. While each of these semiconductor applications have all benefited from key discoveries and inventions along the way, they are all fundamentally enabled by the development of liquid phase epitaxy and, specifically, the invention of the Czochralski-method made in 1916 by Jan Czochralski at AEG labs. In the Czhochralski-process thermally induced precipitation of liquid state material to a solid state crystal is realized by slowly pulling a monocrystalline seed from a hot liquid melt.

While epitaxial growth requires a certain deviation from thermal equilibrium in order to drive continuous crystallization, LPE is carried out at the verge of thermal equilibrium, the main enabler being the similar density of the liquid and the solid state crystal, eliminating diffusion-limitations dominating vapor phase epitaxy where the source material is comparatively dilute in the non-crystalline phase and allowing a minimal deviation from the melting temperature to instigate crystal growth. When the temperature of the system is uniform and the system is in equilibrium the atomic sticking-rate (rate of precipitation) equals the atomic dissociation rate. "Perfect Crystal" growth-conditions above are established when the incorporation of adatoms at crystal lattice sites offer a sufficiently higher decrease in free energy than the incorporation of adatoms at positions of interstitials and vacancies [See Handbook of crystal growth IA Chapters 2 and 8]. In contrast, growth methods far away from thermal equilibrium, such as metal organic vapour phase epitaxy (MOVPE or MOCVD), epitaxial growth is largely limited and governed by the diffusion of source material to the crystal surface and the energy difference between atomic incorporation at perfect lattice sites versus an interstitial site or the creation of a vacancy are insignificant.

The Czochralski-process is the predominantly used method for fabrication of semiconductor wafers used by the semiconductor industry and crystal growth by a liquid/solid phase transition, liquid phase epitaxy (LPE), is still the only established method for fabrication-method of high perfection large diameter semiconductor crystal wafers, be it Si, Ge, GaAs, GaP, or InP semiconductors [Handbook of Crystal Growth IIA, Chapter 2]. Crystal defects, such as impurities, vacancies and crystal dislocations can, already at extremely low concentrations, deteriorate electrical and optical properties of the semiconductor. Over hundred years there is little that has changed within the basic fabrication of semiconductor material and the designation of Jan Czochralsiki as "The father of Semiconductor technology" is as valid today as it was then.

The group of binary III-V semiconductors comprising GaN, AlN, InN and their ternary and quaternary alloys are usually simply referred to as "nitrides". The nitrides are unique in their span of properties and potential use. Based on theoretical properties alone, the nitrides comprise the most efficient semiconductor alternatives for high power, radio frequency, and the only viable alternative for true RGB white light-sources and short wavelength LEDs and Lasers from violet through UV. They are, however, also unique in being the only commonly used semiconductors where LPE isn't used to produce wafers. Instead they are usually fabricated by mismatched growth on other crystal substrates, such as SiC, Sapphire and Si wafers. This is unfortunate, since the mismatched crystal growth generates high densities of crystal dislocations, The predominant challenge for making high perfection semiconductor nitrides is the inability to establish epitaxial conditions close to thermal equilibrium. This is a result of the impossibility to create and contain liquid GaN. The melting point of GaN has been known to be high but it was not until recently that work showed the conditions needed to form congruent GaN melt, at 6 Gigapascal (GPa) and a temperature of 2700° C. [Utsumi et al., Nature Materials, 2, 235, 2003].

Alternative methods for fabricating bulk GaN have been developed, such as ammonothermal growth, solution based growth and HYPE, each with their own advantages [Technology of GaN Crystal Growth, Ehrentraut, Meissner and Bockowski, Springer, 2010]. While they all and together represent great strides forward to an extremely challenging system, they all rely on transport mechanism and comes short of the previously discussed ideal equilibrium conditions of a pure liquid-solid system where the similar density of the liquid and solid phase ensures immediate access to growth species at the growth site, unrestricted by diffusion. Nowadays, there are commercially available small sized bulk GaN, having dislocation densities lower than 10E5 cm$^{-2}$, although at very high price levels and limited quantities.

Epitaxial growth of nitride device layers, are generally carried out by MOCVD. Modern MOCVD reactors are able to accommodate multiple 8" wafers in one run and sustains LED market through GaN/InGaN blue LEDs, and certain niches of power and RF electronics through AlGaN/GaN HEMT structures. In all but the most esoteric application, the base GaN layers and device layers are grown in a single MOCVD-sequence, on foreign substrates, SiC, Sapphire or Si. These substrates are all different from GaN in crystal structure and lattice-size with the introduction of misfit induced lattice dislocations penetrating the device layers as an inevitable consequence.

For various types of electronic devices, such as HEMT (high electron mobility transistor) or HFET (heterojunction field effect transistor) structures, III-nitride material such as Gallium nitride (GaN) material has superior properties with regard to e.g. electron mobility (speed, efficiency) and high voltage ability than both Si-based materials. However, GaN technology generally entail higher cost than Si technology, and is often inferior in material quality and high voltage reliability compared to e.g. SiC technology. This due to the use of foreign substrates necessitated by inability to fabricate sufficient production levels of GaN native substrates at commercially viable cost levels. Thus, major limits of GaN electronics technology boil down to material crystal dislocations and wafer production cost, related to minimization of dislocations originating from growth on foreign substrates, such as SiC.

Various solutions to these problems were suggested by one of the instant inventors in the U.S. patent application Ser. No. 14/378,063, published as US2015/0014631, the content of which is incorporated herein in its entirety by reference. In that application, a method for making a semiconductor device was described, including steps for forming a plurality of semiconductor nanowires over a substrate through an insulating growth mask located over a substrate, forming a semiconductor volume element on each nanowire, planarizing each volume element to form a plurality of discreet III-nitride semiconductor mesas having substantially planar upper surfaces, and forming a device in each of the plurality of base elements. Each mesa has a substantially planar c-plane {0001} upper surface. The device may also include at least one electrode located over each semiconductor mesa. The process for planarizing grown III-nitride elements is proposed to include in situ etch back of a pyramidical structure, as obtained at the volume growth, by etching or polishing, to form a wide c-plane parallel to the substrate.

SUMMARY OF THE INVENTION

Various embodiments within the scope of the invention are defined in the claims. Other objects, advantages and novel features of the invention will become apparent from the following detailed description of the invention when considered in conjunction with the accompanying drawings and claims.

According to one aspect, the invention relates to a method of making a semiconductor device, comprising:

forming a plurality of semiconductor seeds of a first III-nitride material through a mask provided over a substrate;

growing a second III-nitride material on the seeds;

planarizing the grown second III-nitride material to form a plurality of discrete base elements having a substantially planar upper surface.

In one embodiment, the step of planarizing involves performing atomic re-distribution of column-III atoms of the grown second III-nitride material under heating to form the planar upper surface with nitrogen supplied in vapor phase.

In one embodiment, the step of planarization is carried out with a high supply of nitrogen molecules, while throttling addition of atoms of the column-III of the second III-nitride material.

In one embodiment, the step of planarization includes dissociation of column III atoms from the crystal lattice of the second III-nitride material, while providing a saturated supply of nitrogen to allow for precipitation of said dissociated column III atoms.

In one embodiment, the condition of a saturated supply of nitrogen is fulfilled when precipitation of dissociated column-III atoms is not limited by gas phase diffusion of nitrogen.

In one embodiment, said nitrogen is provided from $NH_3$ molecules.

In one embodiment, the step of planarization is carried out at an elevated temperature of 900-1200° C. where the column III material of the second III-nitride is Ga.

In one embodiment, the step of planarization is carried out at an elevated temperature of 700-1200° C. where one column III material of the second III-nitride is In.

In one embodiment, the step of planarization is carried out at an elevated temperature of 900-1500° C. where one column III material of the second III-nitride is Al.

In one embodiment, the step of planarization is carried out without supply of additional III type atoms.

In one embodiment, the second III-nitride semiconductor material is the same as the first material, and the step of growing involves growing nanowires.

In one embodiment, the method includes a step of forming a semiconductor volume element on each nanowire In one embodiment, the step of growing a second III-nitride semiconductor material involves forming a semiconductor volume element on each seed.

In one embodiment, the first III-nitride material is GaN or InGaN, and the second III-nitride material is GaN, InGaN or AlGaN.

In one embodiment, the method comprises the step of growing a repair layer of the second III-nitride material on the substantially planar upper surface.

In one embodiment, the method comprises forming a device comprising an electrode in or on each of the plurality of base elements.

In one embodiment, the method is carried out in a CVD or VPE machine, and characterized in that the steps of growing and planarizing are carried out without intermediate removal of the device from the machine.

According to another aspect, the invention is related to a semiconductor device, comprising:

a substrate;

a plurality of III-nitride semiconductor seeds or nanowires extending from mask holes on the substrate;

a plurality of discreet III-nitride semiconductor mesas, wherein each of the plurality of mesas are located around and over each of the plurality of the nanowires or seeds; and at least one electrode located over each semiconductor mesa.

In one embodiment, the semiconductor device comprises any of the elements, structures, or features obtainable by the method above.

BRIEF DESCRIPTION OF THE DRAWINGS

Preferred embodiments of the invention will now be described with reference to the accompanying drawings.

DETAILED DESCRIPTION

Certain embodiments of the invention relate to methods of making a III-nitride semiconductor device. This III-nitride material may e.g. be GaN, InGaN (Indium Gallium nitride), or AlGaN (Aluminum Gallium nitride). The method may comprise forming a plurality of semiconductor seeds over a substrate. The substrate may be any suitable material for growing III-nitride seeds or nanowires, for example a GaN, silicon, SiC, sapphire or AlN wafer which may optionally contain one or more buffer layers, such as a GaN buffer layer on a silicon substrate. For homogeneous fabrication of GaN wafers and arrays the basic atomic information the substrate material provides to the process is a uniform crystal orientation to all seeds and a competitive surface for selective nucleation of GaN. Such a surface may be provided through thin films, such as graphene, ALD-fabricated oxides and LPCVD-fabricated AlN. In various embodiments, the seeds are continuously grown to nanowires. In various embodiments, a semiconductor volume element is grown on each seed or nanowire. In a planarizing step, a plurality of discrete templates, or base elements, having a substantially planar upper surface, are formed. After planarizing, a step of c-plane surface repair growth may also be performed. Subsequent steps may include forming a device, such as an electronic component, in or on each of the plurality of base elements.

As will be discussed, the planarizing step is most appropriately also called a reformation-step. It's our understanding that the large scale homogeneity seen in the reformation step discussed herein is enabled by homogeneous crystal structure of the dislocation-free crystal templates used. Hitherto, the only known way to provide such an array of dislocation-free templates is through selective NW-growth. Furthermore, a fundamental level it is understood that the dislocation-free nature of the array is dependent on combination of the aperture dimension of the opening in the mask and the specific epitaxial growth conditions. NW growth conditions are no magic bullet but has been shown to provide such dislocation-free crystals. Since the generation of dislocation-free crystals is the prominent task of the NW growth step and, for the purpose of this application, any epitaxial conditions that provides such monocrystalline templates are considered to be NW-conditions.

Different embodiments will now be discussed with reference to the drawings. It shall be noted that reference is made to certain examples of devices and methods, where materials and process parameters of working embodiments are given. This does not, as such, mean that certain steps or features may be of a different character or art without departing from the general scope of the solutions proposed herein, and which fall within the scope of the appended claims. In addition, more details related to e.g. nanowire growth in III-nitride materials are available to the skilled person in e.g. the above-referenced prior application.

Figure 1:
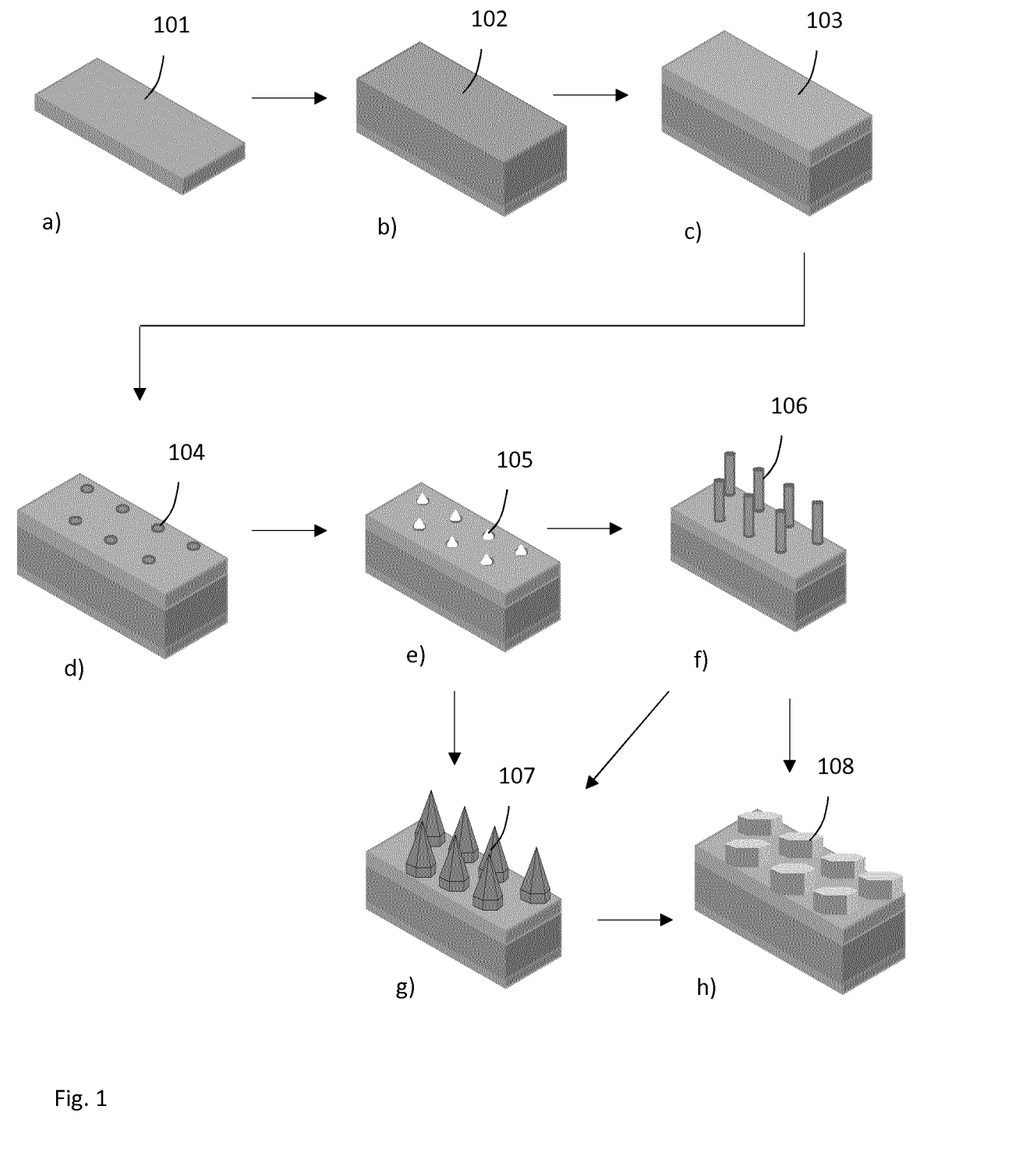
FIG. 1 schematically illustrates various devices and steps of a production process for a III-nitride semiconductor device according to different embodiments.

FIG. 1 schematically illustrates method step of the production of a III-nitride semiconductor device. In a step a) a base substrate 101 of e.g. sapphire is provided. In a step b) one or more layers 102 of e.g. GaN are formed on the base substrate 101. Together, the layers 101 and 102 form a substrate. In a step c) a mask layer 103 of e.g. $SiN_x$ may be formed on top of the substrate. In a subsequent step d), holes 104 are provided in the mask layer 103, e.g. by means of EBL (electron beam lithography). The holes may be very narrow, e.g. with a diameter of 50-150 nm, or 60-100 nm. The pitch between the holes 104 may e.g. be in the order of 200-2000 nm, and is selected dependent on inter alia the electronic devices to be formed on the templates which are to be created on the substrate, and may also depend on the material of the III-nitride. In a step e) growth of a first III-nitride material is performed or at least initiated. Step e) indicates the initial growth, in the form of substantially pyramidal seeds 105, protruding from the holes 104. In a subsequent step f), which need not be included in all embodiments, as will be explained, the seeds 105 are grown into nanowires 106, by continued growth of the III-nitride material of the seeds 105, e.g. by CVD or VPE in a nanowire growth step, wherein a nitrogen source flow and a metal-organic source flow are present. In an embodiment including growth of nanowires as in step f), the process from d) to f) is typically continuous.

In one embodiment, the seed 105 and subsequently grown nanowires 106 comprise GaN. By growth from holes 104, which represent a very small portion of the substrate surface, a large majority of any dislocations in the substrate III-nitride 102 are filtered out. In addition, dislocations close to the edge of a hole 104 tend to bend off towards one side of the grown nanowire 106. Nanowires of GaN are thus grown, normally in a hexagonal shape with 6 equivalent and smooth m-plane facets, where dislocations are seen to terminate towards the $SiN_x$ mask. The result is entirely or substantially dislocation free seeds 105 or nanowires 106 of GaN, e.g. to a degree of at least 90% or at least 99% of the seeds 105 or nanowires 106 being dislocation free.

A nitride semiconductor nanowire 106 as discussed herein is in this context defined as an essentially rod-shaped structure with a diameter less than 1 micron, such as 50-100 nm and a length up to several μm. The method of growing nitride semiconductor nanowires according to one non-limiting embodiment of the invention utilizes a CVD based selective area growth technique. A nitrogen source and a metal-organic source are present during the nanowire growth step and at least the nitrogen source flow rate is continuous during the nanowire growth step. The V/III-ratio utilized for nanowire growth is significantly lower than the V/III-ratios commonly associated with the growth of nitride based semiconductor, as also outlined in the referenced earlier US application.

For an embodiment of GaN, processing according to g) of FIG. 1 may continue. Here, a GaN volume element 107 is grown on each nanowire 106. This step of forming the volume element 107 on the nanowires 106 may be carried out by CVD or VPE in a volume element growth step, wherein the nitrogen source flow and the metal-organic source flow are present. Preferably, the molar V/III-ratio during the volume element 107 growth step is higher than the molar V/III-ratio during the nanowire growth step. The volume element 107 grows to comprise a discreet insulating or semi-insulating GaN pyramid formed around each GaN nanowire 106.

In an alternative embodiment, processing according to step g) of FIG. 1 may be performed from the seed stage of e), without fully growing nanowires 106, as indicated by the vertical arrow in the drawing between steps e) and g). Also this step of growing a GaN volume element 107 on seeds 105 may be carried out by CVD or VPE in a volume element growth step, wherein the nitrogen source flow and the metal-organic source flow are present. Preferably, the molar V/III-ratio during the volume element 107 growth step is higher than the molar V/III-ratio during the seed growth step. The volume element 107 grows to comprises a discrete insulating or semi-insulating GaN pyramid formed around each GaN seed 105. Further details related to volume growth may also be obtained e.g. from the referenced US application by the instant inventor.

The process also includes a planarizing step. This may be carried out either after a nanowire growth step f), or alternatively after a volume element 107 growth step g), as indicated in FIG. 1.

In one embodiment, in which a GaN growth of nanowires 106, and potentially also a GaN volume element 107, is subjected to planarizing to obtain a flat c-plane mesa as shown in h), the inventors have discovered the surprising effect that, by carefully selecting process parameters, the planarization can be performed without, or at least without any significant, desorption of GaN. In such an embodiment, the planarization is instead obtained by controlled atomic redistribution of the nanostructure, i.e. the nanowire 106 when planarizing from f) to h), or the volume element 107 when planarizing from g) to h). Such a step may be carried out by providing a high, or even very high, flow of Nitrogen-containing material, typically $NH_3$, while throttling, or preferably completely omitting, supply of additional flow of Ga source material. In other words, no or substantially no new Ga atoms are supplied. In one embodiment, the flow of $NH_3$ may e.g. be in the order of 5-20, in certain embodiments within 9-10 slm, while the Ga source is completely shut off. The process temperature may be maintained as held in a receding volume growth step, or be elevated, e.g. in the range of 1000-1200 degrees Celsius for GaN (the range going down to 700 for InGaN growth and up to 1500 for AlGaN growth). The inventors have found that the research results indicate that by selecting suitable process conditions, Ga atoms may break their crystal bond, without actually being completely desorbed and leave the GaN crystal surface. Instead, single Ga atoms may still be physically attached, even if the chemical bond is broken, herein referred to as physisorbed. Such a physisorbed Ga atom may travel on the surface of the GaN device, and reattach at another place. More specifically, given the right conditions, such as exemplified, a cone of a volume growth 107 may grow in the normal direction to the slanting s-plane, such that vertical m-planes underneath, and the planar top c-plane, increase. By providing the high $NH_3$ flow, or back pressure, while the temperature is optimally elevated, sufficient mobility of physisorbed Ga atoms is obtained, while excessive dissociation is avoided, such that the described atomic redistribution may be obtained. The process temperature at the planarizing step should preferably still be kept below a certain upper level, for the purpose of avoiding a three phase system where liquid Ga may form droplets on the surface of the GaN device.

Figure 2A:
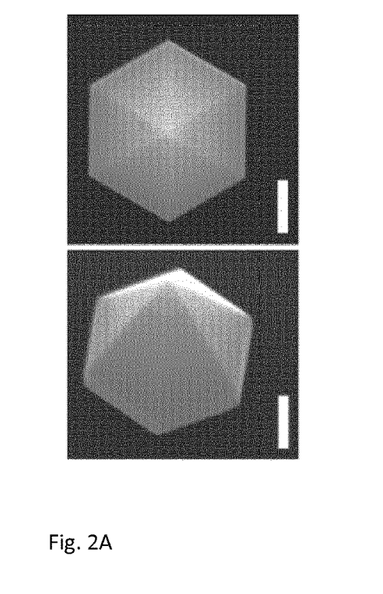
FIGS. 2A and B illustrate embodiments of different stages of a GaN device in production.
Figure 2B:
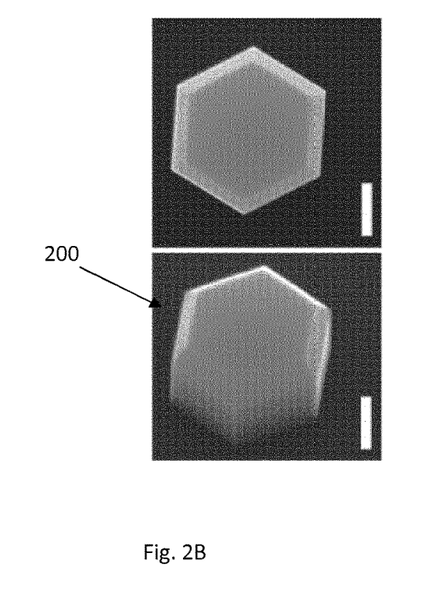

Exemplary test results are depicted in FIG. 2, where FIG. 2A shows a substantially cone-shaped or pyramidal GaN device as created by volume growth 107. FIG. 2B illustrates the transformation of a device of FIG. 2A, when subjected to planarization by atomic redistribution, as described. Evidently, the m-planes and the c-plane have increased, while the s-plane has decreased. The result is, inter alia, that an enlarged c-plane has been obtained, usable for providing e.g. epitaxial layers or other provision of contacts etc. Still, the decreased or even eliminated degree of dislocations in the GaN surface as obtained by mask growth, is maintained. In other words, the average amount of dislocations per surface area unit is substantially lower, ideally nil, as compared to an epitaxially grown continuous GaN surface, such as layer 102. Furthermore, the increase of the c-plane in the planarization step can be obtained in situ, without removal of the substrate from the machine after nanowire and potential volume growth, and without involvement of other material, such as etchants. This way, process speed and reliability may be improved. Test results have also shown that in one embodiments, atomic reconstruction may be carried out under circumstances such that mobile physisorbed Ga atoms will rather attach on the m-plane than on the c-plane. In such an embodiment, the results of the in crystal reconstruction involves the effect that a wider c-plane may be, which is usable for component configuration, than for a pure etching or polishing process.

Figure 3A:
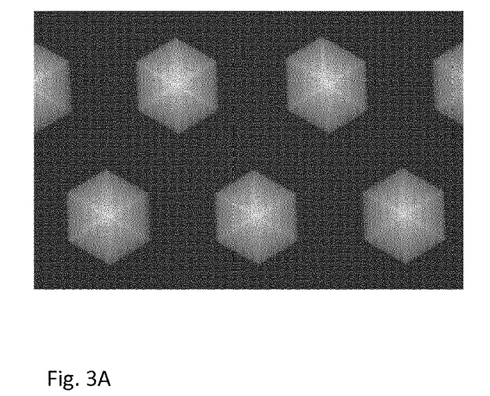
FIGS. 3A-C illustrate embodiments of different stages of an InGaN device in production.
Figure 3B:
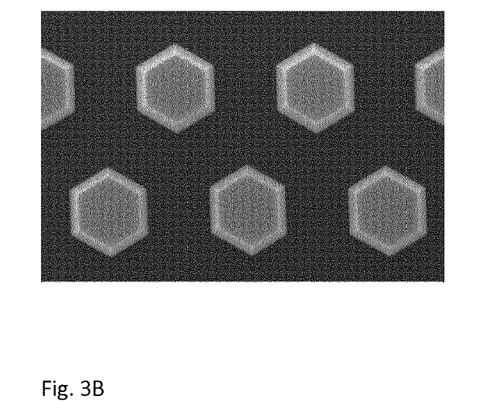

In one embodiment, the suggested process is applied for an InGaN device. In such a process, steps a) to d) are also included. In one variant, the substrate layer 102 may also include an InGaN layer, on which a seed 105 and subsequently a nanowire 106 is grown of InGaN. Volume growth of InGaN is then carried out, on the InGaN nanowire 106, in step g). In an alternative embodiment, which has provided more reliable lab results, the process from a) to e) is the same as for GaN, i.e. with GaN seed growth on a GaN substrate layer 102. However, the GaN growth is stopped at the seed stage, preferably when the seed 105 is only a small pyramid, preferably with no m-plane over the mask level. After that, volume growth of InGaN is applied onto the GaN seed 105, to the state of a pyramid volume as in g). By starting with GaN growth, a lower level of dislocations may potentially be provided in the seed 105. In addition, by providing volume growth of InGaN already on the small seed 105 of GaN, rather than on a GaN nanowire, the risk for dislocation errors in the volume growth is minimized In the planarizing step from g) to h) of an InGaN volume 107 at an elevated temperature, a high degree of dissociation is normally involved, and may be dominating over any atomic redistribution. FIG. 3A illustrates an InGaN volume device 107, and although this is only a top view, its pyramidal shape is evident. FIG. 3B shows such volume device after planarizing, e.g. at a temperature in the range of 1100-1200 degrees Celsius, with a high $NH_3$ flow of 5-10 slm and absent any additional provision of In or Ga during the planarizing step. Also in this case, the planarization is obtained without providing any etchants, and c-plane increase is also obtained without any minimization of the width of the devices. As can be seen, though, a pattern of trenches may occur in the c-plane surface, potentially caused by the different boiling temperature of In and Ga. In a preferred embodiment, a repair step of providing additional InGaN growth may therefore be carried out, after planarization. When doing so, pyramidal growth will again occur, as during the preceding volume growth step from e) to g).

Figure 3C:
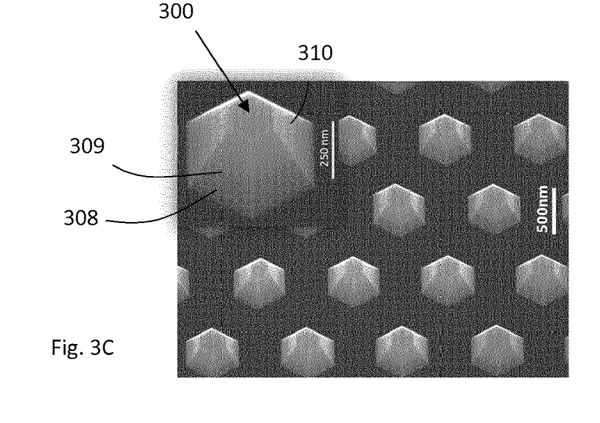

However, only a limited number of atomic layers are required, and after that, further epitaxial growth may be carried out to form electrical components, e.g. red and green light-emitting diodes. FIG. 3C shows a slanted image of such a device 300, where the planarized InGaN body 308 forms the base part, additional InGaN repair layers 309 are provided thereon, and epitaxial component layers 310 are formed on the repair layers 309.

Figure 4:
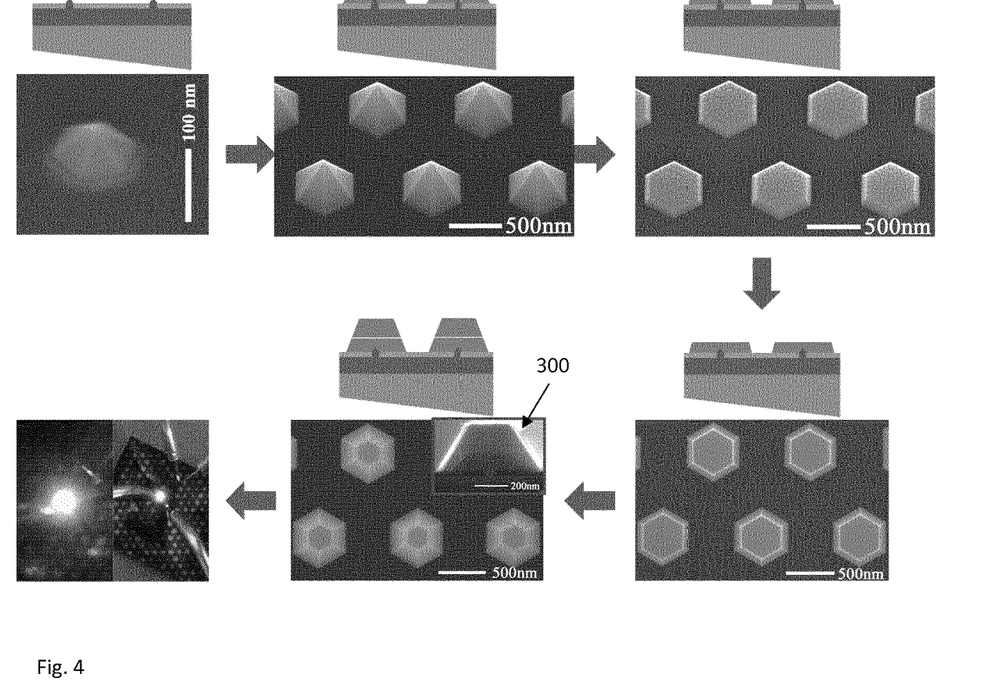
FIG. 4 schematically illustrate process steps of a production process of an InGaN-based light-emitting component.

Also FIG. 4 illustrates the process of manufacturing a light emitting diode on an InGaN device as described with reference to the preceding description and drawings, starting from a GaN seed. In the middle lower picture of FIG. 4, the side view of device 300 also clearly shows the layers 308, 309, and 310.

In one embodiment, the general growth process incorporating planarization is employed for the production of AlGaN devices. One such device 500 is shown in a side cross-section view in FIG. 5. The high degree of reactivity of Al with other materials presents a hurdle for growing AlGaN from mask holes, since the Al may grow on the mask too. For this reason, the inventors have come up with a new way of manufacturing planar AlGaN templates, on which to provide further epitaxial growth for component production. Referring back to FIG. 1, the process steps from a) to f) are carried out with GaN, for the beneficial reasons already referred to with regard to elimination or minimization of dislocations. (The process may alternatively be halted already at the seed level of e), dependent inter alia on hole size and on how large GaN planar mesas are desired.) After a plurality of GaN nanowires 106 (or seeds 105) have been grown to contain desired volume, a planarizing step is carried out at h). In other words, there is preferably no volume step g) involved in the AlGaN process.

Figure 5:
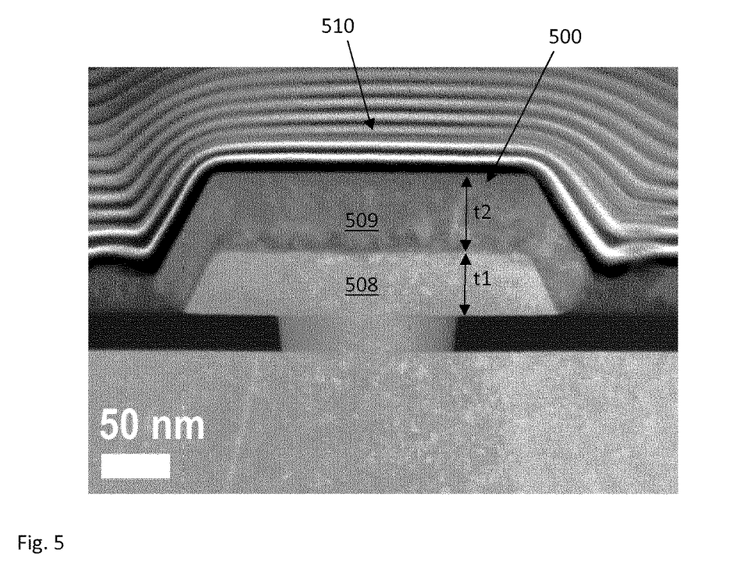
FIG. 5 shows a side view of an AlGaN device with further epitaxial layers built on top.

The result after atomic distribution as described above for GaN, will be a flat mesa 508 with a relatively small diameter, e.g. compared to the hole, since there is much less material in the growth when no volume growth step has been carried out. As an example, for a mask hole 104 size of 60-100 nm, the planarized GaN mesa structure 508 may have a width of 200-300 nm, i.e. in the range of only e.g. 2-5 times the mask hole size. In addition, the flat GaN structure will be configured, by atomic redistribution, to be very thin, e.g. with a GaN thickness t1 in the range of 30-100 nm.

In a subsequent process step, AlGaN growth is begun. As noted, layers may then grow on all parts of the substrate and on all facets of the flat GaN mesas. More importantly, AlGaN growth is deliberately continued until a layer 509 having a relatively large thickness t2, compared to t1. The reason for this is that any plastic deformation, as caused by the gitter mismatch between GaN and AlGaN, will occur in the GaN layer 508 rather than in the AlGaN layer 509. So, rather than a thin AlGaN layer 509 stretching to adapt to the crystal structure of the GaN mesa layer 508, a relatively thick AlGaN layer 509 will compress or contract the GaN layer 508, in the region of the interface between the materials. The growth of AlGaN layer 509 shall preferably be carried out at a comparatively low temperature, for AlGaN growth, which will help retain template shape at subsequent higher temperatures when adding layers over layer 509. The result is a substantially or entirely dislocation free AlGaN layer, on which further epitaxial layers 510, contacts or other component structures may be built.

In various embodiments, incorporating any one of the above-referenced embodiments and materials, the process may involve epitaxially growing a semiconductor displacing layer on the planarized volume element such that an upper surface of the displacing layer is located above the upper tip of the nanowire or seed, and the upper surface of the displacing layer forms the upper surface of each of the base elements, or alternatively that planarizing is halted at a stage where said tip is still below the upper c-plane layer of the planarized device.

The solutions outlined above, for providing flat structures of III-N semiconductor material, such as e.g. GaN and InGaN, in the form of platelets or even coherent flat layers is a great and also unexpected achievement. It is now 100 years since the so-called Czochralski process was invented, according to which a solid crystal is slowly pulled up from a melt. This is still the basis for growth of Si ingots. Other, similar, techniques used for fabrication of conventional semiconductors, such as Ge, GaAs, GaP and InP, are the Bridgman technique and the float zone process. These technologies all have in common the use of a liquid/solid growth front, with a minutely controlled growth rate and temperature gradient, $\Delta T$, and initiated from a dislocation-free crystal seed. In these growth processes, $\Delta T$ will determine the growth rate, with a high $\Delta T$ forcing fast condensation of the crystal. In the Czochralski process the "Perfect Si Crystal" conditions are met when the growth rate is sufficiently fast as to avoid creation of Si crystal vacancies, but sufficiently slow, or unforced as to avoid incorporation of interstitial Si. In Czochralski growth, a low $\Delta T$ gives a low driving force for precipitation and the system is said to be close to thermodynamic equilibrium. In thermodynamic equilibrium the atoms have the same probability for precipitation into the crystal from the liquid phase as for dissociation from the crystal phase to the liquid. In this case other factors will determine where the atoms go in the end. It is easy to realize that interstitial incorporation of atoms, or inclusions of vacancies represent a smaller decrease in free energy for the system than incorporation of adatoms at their respective lattice sites.

Figure 6A:
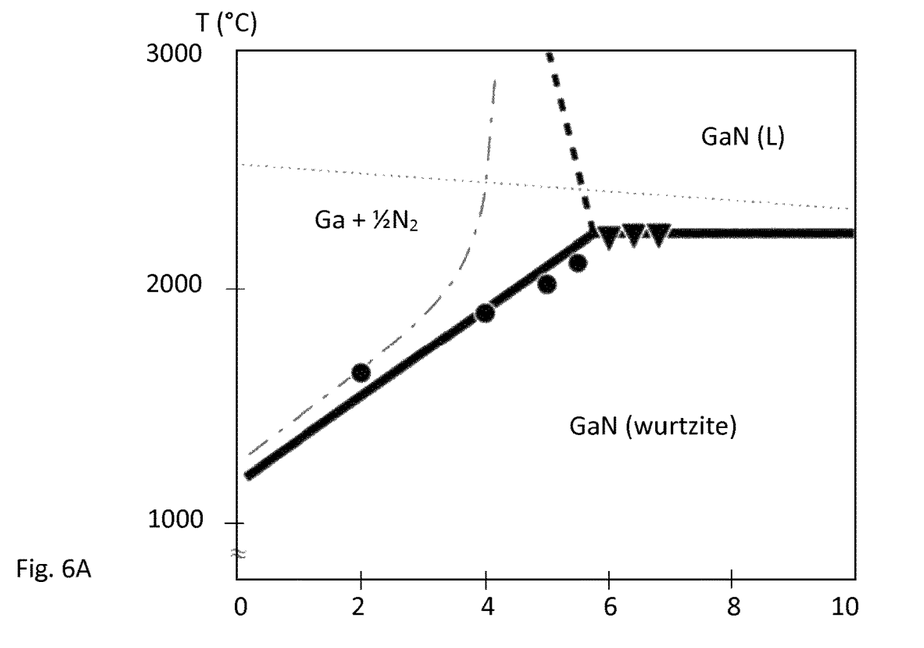
FIGS. 6A-C illustrate various Ga—N binary phase diagrams.

With reference to FIG. 6A, the Czochralski process is a transition between liquid phase and the crystal phase, represented by the double-headed arrow. However, as seen from the diagram, a phase boundary between solid and liquid GaN emerges only at pressures above 6 GPa. This makes liquid phase epitaxy of GaN an immense challenge with GaN semiconductor wafers instead predominantly fabricated on foreign substrates, by metal organic vapor phase epitaxy (MOVPE). In order to improve the crystal quality of GaN grown on sapphire and Si, epitaxial lateral overgrowth (ELO) has been developed in order to reduce dislocation density and provide higher quality substrates, and early results did show much promise and lately it has been adopted for nanowires.

In various embodiments of the solutions proposed herein, though, the epitaxial physics of a peculiar epitaxial regime is explored, which is denoted crystal reformation herein. This crystal reformation may be carried out as a step of planarization of a III-nitride material grown on a seed at a mask opening, as outlined for several different embodiments above. The planarization of the III-nitride material serves to form a plurality of discrete base elements having a substantially planar upper surface. Crystal reformation is performed near equilibrium conditions and supersaturation is not created by addition of material. In contrast to MOCVD growth in general, it's not required to supply the III-V nitride crystal growth front with column III-material in order to drive the phase transition. One significant aspect of equilibrium growth and the described method is reversibility of the phase transition, i.e. the ability to reverse the propagation of the growth front, going forwards or backwards, by changing the thermal bias. In our case the thermal bias, driving the reformation, is supplied by the difference in surface energy of the crystal facets: Net atomic dissociation at one crystal facet takes place simultaneously with net precipitation, or crystallization, at another facet. In this sense the epitaxial growth front comprise all involved facets but local growth rates may be both positive or negative.

In various embodiments, a supply of $NH_3$ is kept in order to avoid degradation of the crystal surface, and the temperature is elevated, as exemplified for various embodiments. In yet another embodiment for GaN, the elevated temperature may be in the range of 900° C. and 1200° C. During the reformation, the inventors have observed the surprising effect that a substantial portion of the crystal is transferred from one facet to another.

Figure 6B:
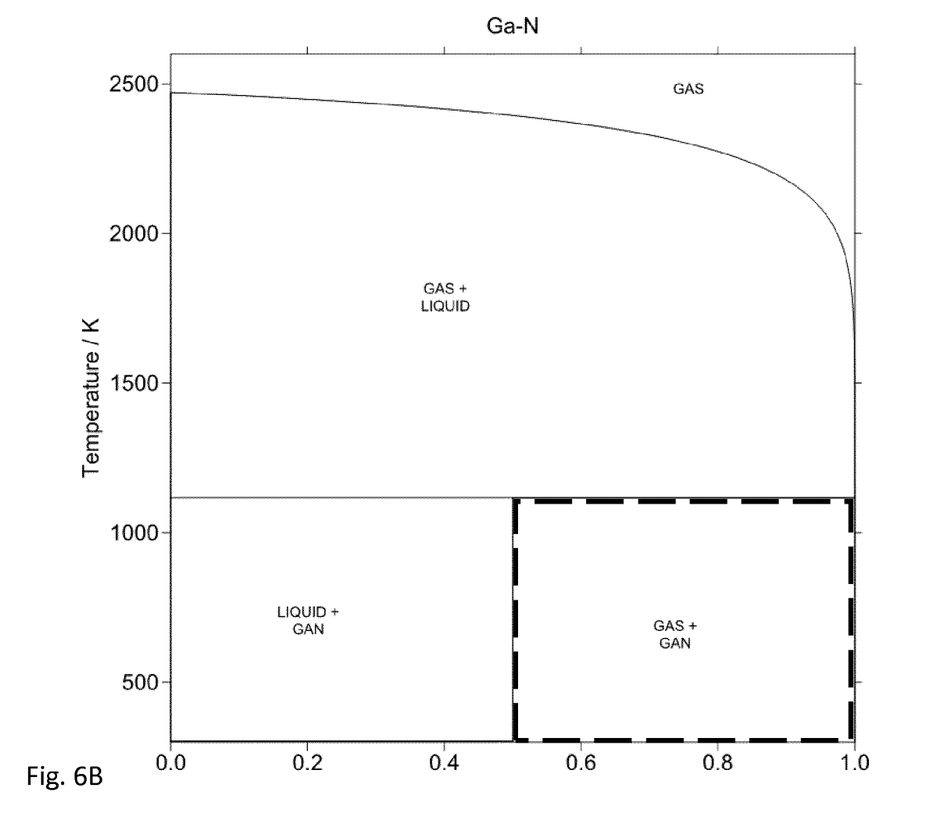
Figure 6C:
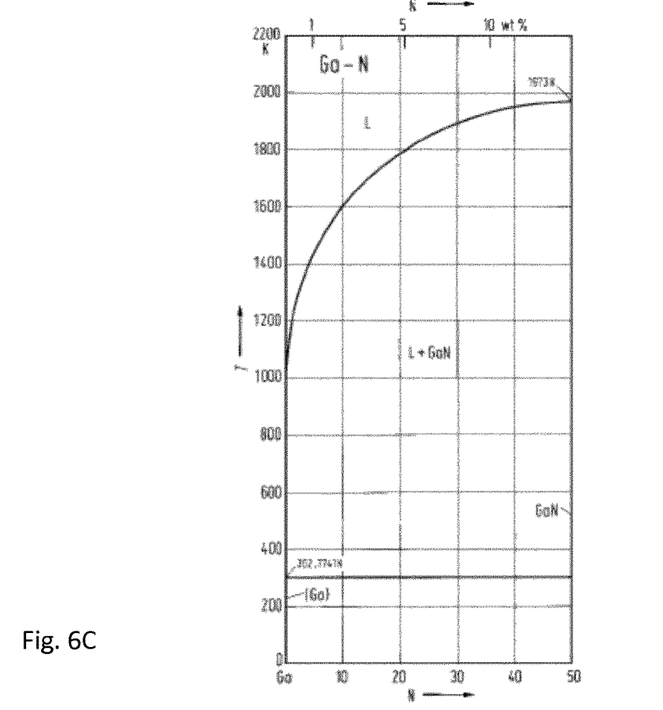

FIG. 6B illustrates a calculated Ga—N phase diagram at atmospheric pressure. Here it may be noted that the Gas+ GaN regime, where the reformation step would be positioned, marked by dashed lines, requires an excess of atomic nitrogen and that Ga would be in liquid form. Furthermore, FIG. 6C shows the known Ga—N binary phase diagram according to Subvolume F 'Ga—Gd—Hf—Zr' of Volume 5 'Phase Equilibria, Crystallographic and Thermodynamic Data of Binary Alloys' of Landolt-Börnstein—Group IV Physical Chemistry. As noted therein, "An experimentally determined phase diagram is not available". This goes to show that hitherto there is in fact not sufficient experimental data to draw the phase-diagram for N>50%, which also is the supposed regime for the reformation step. The solutions proposed herein, for providing planar III-N materials by reformation, consequently form a new solution with beneficial, unexpected results, obtained by processes carried out in an untrodden territory of physics.

The shape-transformation is most likely driven by the surface energies of the facets. Growth on higher order facets are favored, such that formation of lower order facets and the 0001 c-plane is strongly favored, as can be anticipated from published work on kinetic Wulff crystal shapes in GaN. The kinetic Wulff model aims to predict the shape of a small crystal based on the relative surface energy ratios of the facets. The inventors propose to complement this model with an atomic picture, which may be associated with the embodiments described herein:

1. Each atom that dissociates from the crystal may stay in a physisorbed state or desorb to the gas-phase. Since the volume of the crystal remains intact, it may be concluded that desorption can be discounted and the atoms remain physisorbed until they are incorporated to the crystal again.

2. The probabilities for going into a physisorbed state and into a crystal-bound state are both high, but with a higher incorporation probability at the side facets and a higher desorption probability at the top facet (since the crystal height decreases). With high sticking and dissociation probabilities the atoms may alter freely between physisorbed states and crystal bound states. Formation of dislocations, point-defects, vacancies and interstitials usually results in a weaker bonding to the crystal and smaller decrease in free energy of the system than the positioning on a "perfect lattice site". Since the atoms can move freely between crystal-bound states, the atoms will typically end up at the positions with higher binding energy, and there will thus be a bather to form a defect or dislocation, as compared to bonding at a "perfect site".

3. The physisorbed atoms are preferably column-III atoms, most common species being Gallium, Indium, and Aluminium. The natural state for these materials at the conditions used is liquid form (Room pressure melting T: Ga 30° C.; In 157° C.; Al 660° C., all having boiling Ts above 2000° C.). Their vapor pressures are all low, below 1 pascal at 1000° C., explaining the low loss of material through evaporation, although some evaporation-loss will be expected.

4. The physisorbed column III atoms can have rather high diffusion rates and diffusion lengths on the order of 1 μm for Ga and 10 μm for In. A good physical description is the physisorbed atoms forming a two-dimensional cloud on the surface which will retain a constant concentration within the limits of diffusion lengths which in various embodiment is larger than the dimensions of the template structures. The cloud is supplied by dissociation of column III atoms from the crystal lattice and the reformation rate will be given by the relative differences in atomic dissociation rate and sticking rate to the respective facets. As long as the reformation-rate is sufficient low for the surface-diffusive state of column-III material to retain a relatively constant, conformal concentration of column-III material and the dimensions of structure is of similar, or less, length than the diffusion-length, then the supply of III-material will not be diffusion-limited but crystal incorporation is only governed by the activation energy of the crystal binding. This is what usually is referred to equilibrium conditions.

5. In a preferred embodiment, the background flow of $NH_3$ will be sufficiently high when it provides a saturated supply of nitrogen, e.g. through pyrolysis of $NH_3$, which is sufficient to provide a reservoir of nitrogen for III-material atoms to combine with during the reformation, at which a substantially planar upper surface is formed on a template facet, such as on a c plane parallel to the underlying substrate. Pure nitrogen, N2, is inert at the used temperatures but the moderate activation energy for pyrolysis of $NH_3$ supplies us with enough atomic nitrogen to allow us to work with a phase transition touching on the right end side of the diagram in FIG. 6C. However, nitrogen sources with even lower cracking temperatures would allow for reformation at lower temperatures and possibly better control over incorporation of crystal nitrogen vacancies. As a reader skilled in the art of epitaxy will understand, the back pressure or flow of nitrogen needed to provide to a saturated supply of nitrogen will depend on several parameters, such as temperature, type of column III material etc. Nevertheless, a sufficiently saturated supply of nitrogen may be obtained when a nitrogen atom will always be readily available to a column III atom, which has dissociated from the crystal lattice during the reformation stage. One way of defining the occurrence of a sufficient saturated supply of nitrogen may be the absence of, or a very low, concentration gradient of nitrogen over a stagnation layer covering the semiconductor surface. Dependent on other parameters, as well as on the required level and quality of reformation, the supply of nitrogen may be such that the concentration gradient is below e.g. 5%, or below 1%, or even below 1/10, 1/100 or 1/1000%.

As noted, the planar upper surface will be formed and increased by redistribution of column III material, e.g. Ga or In, caused by favored growth on other template facets. At such a sufficiently supply level, the nitrogen supply will not be diffusion limited, thereby fulfilling the condition for equilibrium growth with regards to the column V-element. The condition of a saturated supply of nitrogen is fulfilled when precipitation of dissociated column-III atoms is not limited gas phase diffusion of nitrogen.

Increasing the flow above this level may inhibit surface diffusion of column-III material productive flow of $NH_3$. It's more likely that atomic nitrogen supply is limited by low pyrolysis-rate of $NH_3$. Therefore, the reformation step can be a very good candidate for use of alternative nitrogen sources where more efficient pyrolysis can be achieved. There are several such sources, examples being hydrazine, methylated hydrazine, such as dimethyl hydrazine, tertiary-butylhydrazine, tertiarybutylamine and also nitrogen-plasma, although reactivity of nitrogen radicals could decrease diffusion lengths appreciably.

The nanostructures proposed herein are preferably all based on GaN nanowire seeds, or pyramidal seeds but other compositions of nitride material, including In and Ga can be used. The suggested embodiments are different, mainly due to specific challenges in context of materials and structures grown. Growing high Al composition AlGaN on GaN or high In-composition InGaN on GaN introduce crystal lattice mismatch, therefore the GaN seeds and templates are kept small in size to more easily accommodate strain without introducing new misfit dislocations. It may be even better but more challenging to incorporate In or Al, already during nanowire growth. Also, it may be preferable to use an AlGaN NW or grow and reform an AlGaN template directly. This is currently challenging due to the low diffusion-length of Al atoms but maybe preferably long term when such working conditions can be developed. With that said we should distinguish practical differences between GaN, InGaN and AlGaN methodology from fundamental preferences. All embodiments described may work may work for any combination of nitride material, as ternary nitride NW growth and reformation are further developed.

A great advantage is the elimination of substrate dislocations through the nanowire or seed growth, giving fully dislocation-free platelets. This gives a second similarity to the Czochralski process, since it generates high quality crystals not only due to the well-controlled equilibrium-proximity, but also since it generates its own dislocation free seed.

As noted before, the step of planarizing a grown semiconductor material may be followed by a step of c-plane surface repair growth. This step may be performed at a lower temperature than the planarizing step. In various embodiments, the surface repair growth may be performed by providing a supply of column III material, preferably the same column III material as in the planarized second III nitride material, and may result in additional layers of pyramidal growth. In preferred embodiment, the repair layer thus created may only include one or a few atom layers, such that there will be no substantial decrease of the planarized template surface. Subsequent steps may include forming a device, such as an electronic component, in or on each of the plurality of base elements, on top of the repair layer, e.g. by further epitaxial growth.

Various processes for preparing III-nitride semiconductor devices have been provided above, which devices are suitable for further processing to carry or incorporate semiconductor electronic devices, such as Schottky diode, p-n diode, MOSFET, JFET, HEMT etc. Further details on embodiments for fabrication of various such electronic devices can be found e.g. in the referenced patent application.

The invention claimed is:

1. A method of making a semiconductor device, comprising:
    forming a plurality of semiconductor seeds of a first III-nitride material through a mask provided over a substrate;
    growing a second III-nitride material comprising InGaN directly on the seeds;
    planarizing the grown second III-nitride material by breaking bonds of gallium atoms of the InGaN to provide physisorbed gallium atoms, and redistributing the physisorbed gallium atoms on a surface of the InGaN to form a plurality of discrete base elements having a substantially planar upper surface.

2. The method of claim 1, wherein the step of planarizing involves performing atomic re-distribution of column-III atoms of the grown second III-nitride material under heating to form the planar upper surface with nitrogen supplied in vapour phase.

3. The method of claim 2, wherein the step of planarizing includes dissociation of column III atoms from the crystal lattice of the second III-nitride material, while providing a saturated supply of nitrogen to allow for precipitation of said dissociated column III atoms, and
    wherein the saturated supply of nitrogen is a flow of nitrogen sufficient to ensure that a concentration gradient of nitrogen over a stagnation layer covering the upper planar surface is below 5%.

4. The method of claim 3, wherein the condition of a saturated supply of nitrogen is fulfilled when precipitation of dissociated column-III atoms is not limited by gas phase diffusion of nitrogen.

5. The method of claim 4, wherein said nitrogen is provided from $NH_3$ molecules.

6. The method of claim 1, wherein the step of planarizing is carried out at an elevated temperature of 700-1200° C.

7. The method of claim 1, wherein the step of planarizing is carried out without supply of III type atoms.

8. The method of claim 1, wherein the second III-nitride semiconductor material is the same as the first material, and the step of growing involves growing nanowires.

9. The method of claim 8, further comprising a step of forming a semiconductor volume element on each nanowire.

10. The method of claim 8, wherein the step of growing a second III-nitride semiconductor material involves forming a semiconductor volume element on each seed.

11. The method of claim 1, wherein the first III-nitride material is GaN.

12. The method of claim 1, further comprising the step of growing a repair layer of the second III-nitride material on the substantially planar upper surface.

13. The method of claim 1, further comprising forming a device comprising an electrode in or on each of the plurality of base elements.

14. The method of claim 1, wherein the method is carried out in a CVD or VPE machine, and the steps of growing and planarizing are carried out without intermediate removal of the device from the machine.

15. The method of claim 1, wherein the step of planarizing the grown second III-nitride material comprises breaking the bonds of the gallium atoms of the InGaN to provide the physisorbed gallium atoms without desorbing the gallium atoms, and redistributing the physisorbed gallium atoms on a surface of the InGaN.

* * * * *